United States Patent
Novotny et al.

(10) Patent No.: US 9,285,129 B2
(45) Date of Patent: Mar. 15, 2016

(54) FREE-COOLING INCLUDING MODULAR COOLANT DISTRIBUTION UNIT

(75) Inventors: Shlomo D. Novotny, Wayland, MA (US); John P. Menoche, North Smithfield, RI (US); David W. Roden, Coventry, RI (US)

(73) Assignee: Vette Technology, LLC, Pelham, NH (US)

( * ) Notice: Subject to any disclaimer, the term of this patent is extended or adjusted under 35 U.S.C. 154(b) by 1072 days.

(21) Appl. No.: 12/570,254

(22) Filed: Sep. 30, 2009

(65) Prior Publication Data

US 2010/0078160 A1 Apr. 1, 2010

Related U.S. Application Data

(60) Provisional application No. 61/101,214, filed on Sep. 30, 2008.

(51) Int. Cl.
| | |
|---|---|
| H05K 7/20 | (2006.01) |
| F24F 5/00 | (2006.01) |
| F25B 15/00 | (2006.01) |
| F24F 3/06 | (2006.01) |
| F28D 9/00 | (2006.01) |
| F28D 15/00 | (2006.01) |
| F28F 27/00 | (2006.01) |
| G05D 23/19 | (2006.01) |
| F24J 3/08 | (2006.01) |
| F25D 17/02 | (2006.01) |

(52) U.S. Cl.
CPC ............ *F24F 3/06* (2013.01); *F28D 9/0093* (2013.01); *F28D 15/00* (2013.01); *F28F 27/00* (2013.01); *G05D 23/1932* (2013.01); *H05K 7/2079* (2013.01); *F24J 3/08* (2013.01); *F25D 17/02* (2013.01); *Y02B 30/542* (2013.01); *Y02E 10/10* (2013.01)

(58) Field of Classification Search
CPC ......... F25B 15/006; F25B 7/00; H05K 7/202; H05K 7/20154; H05K 7/20709; H05K 7/20263; H05K 7/20236; H05K 7/20272; H05K 7/20609; H05K 7/20645; H05K 7/20654; H05K 7/20772; H05K 7/20781; H05K 7/20809; H05K 7/20818; F24F 5/0046; F24F 5/005
USPC .............. 62/259.2, 144, 175, 179, 235.1, 236, 62/260, 196.1–200; 165/45
See application file for complete search history.

(56) References Cited

U.S. PATENT DOCUMENTS

| | | | |
|---|---|---|---|
| 3,525,385 A | 8/1970 | Liebert | |
| 4,466,815 A | 8/1984 | Southam | |
| 4,653,287 A * | 3/1987 | Martin, Jr. | ...................... 62/181 |
| 7,088,585 B2 | 8/2006 | Chu et al. | |

(Continued)

OTHER PUBLICATIONS

PCT Search Report dated Nov. 19, 2009 of Patent Application No. PCT/US2009/058941 filed Sep. 30, 2009.

*Primary Examiner* — Frantz Jules
*Assistant Examiner* — Erik Mendoza-Wilkenfel
(74) *Attorney, Agent, or Firm* — Brinks Gilson & Lione

(57) ABSTRACT

A system and method for liquid-liquid free-cooling that may include a modular coolant distribution unit (CDU) is provided. CDUs can incorporate integral free-cooling or bolt on free-cooling switch modules. The free-cooling flow can be either direct or indirect. Units can interface with each other to provide scalable cooling for computer data centers. Embodiments of the system can integrate with electronics rack passive rear door liquid heat exchangers.

6 Claims, 10 Drawing Sheets

(56) References Cited

U.S. PATENT DOCUMENTS

| | | | |
|---|---|---|---|
| 7,660,116 B2* | 2/2010 | Claassen et al. | 361/696 |
| 2001/0003311 A1* | 6/2001 | Karl | B60H 1/00921 165/202 |
| 2003/0150231 A1 | 8/2003 | Spinazzola et al. | |
| 2006/0042289 A1 | 3/2006 | Campbell et al. | |
| 2006/0060340 A1 | 3/2006 | Busse et al. | |
| 2007/0193721 A1 | 8/2007 | Tilton et al. | |
| 2007/0213000 A1 | 9/2007 | Day | |
| 2007/0213881 A1 | 9/2007 | Belady et al. | |
| 2008/0016890 A1 | 1/2008 | Dominguez | |
| 2008/0116289 A1* | 5/2008 | Lochtefeld | F24F 3/06 237/81 |
| 2008/0271471 A1* | 11/2008 | Nozawa et al. | 62/179 |
| 2009/0268404 A1* | 10/2009 | Chu et al. | 361/696 |
| 2009/0293507 A1* | 12/2009 | Narayanamurthy | F24F 5/0017 62/59 |

\* cited by examiner

Bolt-On Free-Cooling Switch Module

Direct Flow Embodiment

Indirect Flow Embodiment

Modular Free Cooling System Overview

Modular Scalable Operation Flow Chart

Single Loop Free-Cooling Embodiment

Liquid/Liquid HX Free-Cooling

Modular Scalable Coolant Distribution Unit

FREE-COOLING INCLUDING MODULAR COOLANT DISTRIBUTION UNIT

RELATED APPLICATIONS

This application claims the benefit of U.S. Provisional Application No. 61/101,214, filed Sep. 30, 2008; this application is herein incorporated in its entirety by reference.

FIELD OF THE INVENTION

The invention relates to a system and method for flexibly providing and controlling cooling of heat generating equipment, and more particularly, to a free-cooling capability that may be incorporated with modular coolant distribution units (CDUs). Embodiments of the system can integrate with electronics rack passive rear door liquid heat exchangers.

BACKGROUND OF THE INVENTION

Increased computer processing power generates increased heat. Increased processor density in computers concentrates this increased heat in a decreasing volume. The heat generated by the collocation of as many as 84 servers in one computer rack requires a cooling capacity unavailable from many of today's data center cooling systems. Data center cooling systems have been extensions of building air conditioning units used to cool office spaces. These computer room air conditioner (CRAC) systems have employed free-cooling as disclosed in U.S. Pat. No. 3,525,385 to Liebert in 1970. They use outside air to provide cooled room air. Cooled air alone can be insufficient to cool today's data centers. In addition to increased cooling needs, increased utility costs and demand for green business solutions apply increased pressure to find efficient sources for whatever amount of cooling is required.

Multiple figures of merit exist to quantify data center operation with respect to cost and efficiency. These include data center efficiency (DCE), power usage effectiveness (PUE), coefficient of performance (COP), module system efficiency (MSE), and power index (PI). This focus on metrics demonstrates that small improvements have a large impact on the bottom line of data centers. When multimillion dollar annual utility bills are involved, even fractional percentage changes save thousands and can provide rapid returns on investment.

Due to the reliability demands placed on most data centers, each component also needs to be highly dependable and should support back-up operation should a part of the cooling system fail.

There is a need to maintain improvements in computing power while reducing cost and environmental impact.

SUMMARY OF THE INVENTION

A system and method are described for a reliable free-cooling solution. A free-cooling transfer switch integrates with a coolant distribution unit (CDU) to provide liquid-liquid cooling for heat generating components such as servers mounted in computer racks. CDUs can include a bolt on free-cooling switch module or employ an integral free-cooling system. Free-cooling can be a direct or an indirect flow system. These aspects can provide integrated, incremental cooling for changing heat loads. Embodiments provide a modular cooling system supporting multiple coolant distribution units.

The modularity of the system reduces up front costs and permits installation of only components initially needed. It supports any size or tier level data center and supports an air and liquid cooling solution. The system handles workload variations. While rack population density may cause heat load to vary from under one to over 30 kilowatts, workload variations can also cause heat load variations. For example, processors running complex simulations will be at full power, requiring maximum cooling. This may then be followed by idle time producing minimal heat load. The modular CDU efficiently accommodates these cases, incorporating free-cooling as needed.

Some of today's cooling needs can be met by liquid cooling. For example, passive rear door air-liquid heat exchangers are reliable and can provide cooling energy cost savings. They are effective at dealing with data center 'hot-spots' and facilitate deployment of fully loaded racks. They offer space savings and flexibility for sites that have exceeded their cooling capacity.

In embodiments, a cooling system and method comprising a free-cooling switch interfacing with at least one cooling distribution unit (CDU) provides cooling to at least one electronics rack rear door liquid heat exchanger in a data center cooling environment. Embodiments comprise an interface with at least a second CDU, wherein the interface has at least one cooling environment sensor that measures the cooling environment. It has control software monitoring the cooling environment, at least one cooling environment control valve capable of directing cooling among a plurality of CDUs, and at least one rear door liquid heat exchanger. It also has an interface with at least one free-cooling source wherein the interface comprises at least one free-cooling sensor measuring at least one free-cooling cooling source. It has free-cooling control software monitoring the free-cooling source and cooling environment, at least one free-cooling control valve capable of directing cooling among a plurality of CDUs, and at least one rear door liquid heat exchanger.

A free-cooling source such as outside air cools a glycol mixture which cools treated secondary loop water through a liquid-liquid heat exchanger which subsequently cools inside air or a liquid. In another embodiment, outside air cools an inside water loop. The water is cooled by a dry-cooler then returns, flowing through an economizer coil in the CRAC unit. In embodiments, a standalone free-cooling transfer switch selects between a chilled water source and a free cooling loop.

Embodiments provide a liquid-liquid thermal multiplexer cooling switch device for cooling heat generating equipment comprising at least a first loop comprising an interface to at least a first cooling source; at least a second loop comprising an interface to at least a second cooling source; at least a third loop comprising an interface to heat generating equipment; at least one heat exchanger to transfer heat with the cooling sources; and at least one cooling source selector switch directing cooling to the heat generating equipment from the at least first cooling source and the at least second cooling source. For other embodiments, the at least first cooling source is a free-cooling source; and in others at least one cooling source is selected from the group consisting of: ground source geothermal, aquifer geothermal, underwater closed loop, and ambient air. For some embodiments, the heat generating equipment comprises a rear door heat exchanger (RDHx); and the device is integral with at least one coolant distribution unit (CDU). Yet other embodiments comprise a plurality of modular coolant distribution units (CDUs); and the heat exchanger comprises a three-way brazed plate heat exchanger. In another embodiment, the heat exchanger comprises a plate and frame heat exchanger. Further embodiments comprise at least one of a dew point tracking sensor and a free cooling sensor.

For yet other embodiments, multiple liquid-liquid thermal multiplexer cooling switch devices are combined to interface more than two coolant sources to the heat generating equipment; wherein at least one multiplexer cooling switch device is at least one of the at least first cooling source and the at least second cooling source.

In another embodiment, the device comprises an economizer coil within a computer room air conditioning (CRAC) unit. Additional embodiments comprise at least one bypass valve controlling flow between supply and return lines; and at least one of a coolant temperature sensor and air temperature and humidity sensor.

Other embodiments provide a method for directing cooling from multiple sources to heat generating equipment comprising the steps of checking heat load of heat generating equipment; adjusting coolant flow circulation between at least a first cooling source and the heat load as required; checking at least the first cooling source for efficient coolant production; adjusting coolant flow circulation between the at least first cooling source and the heat load as required; re-checking the heat load; re-adjusting coolant flow circulation between the at least first cooling source and the heat load as required; checking at least a second cooling source for efficient coolant production; and adjusting coolant flow circulation between at least second cooling source and the heat load as required, whereby the heat generating equipment is efficiently cooled.

In yet additional embodiments, the step of checking at least the first cooling source comprises checking at least one free-cooling source; and the step of checking at least a second cooling source comprises checking at least one chilled water supply (CWS) source. For others, the adjusting steps adjust coolant flow based on at least a set point of at least one coolant distribution unit (CDU). And in others, the circulation comprises direct flow; and for others, indirect flow.

Further embodiments include an integrated, incremental, liquid-liquid free-cooling system accommodating varying equipment rack heat loads in a data center comprising at least a first passive rear door heat exchanger (RDHx) coolant loop interfacing with an RDHx; at least a second free cooling source coolant loop interfacing with a free cooling source; at least a third chilled water supply (CWS) coolant loop interfacing with a CWS; at least one bypass circuit for load control in at least one of the loops; a three-way heat exchanger interconnecting the first, second, and third loops, wherein at least one the loop comprises automatic filling and bleeding; at least a first and a second proportional three-way valve controlling flow in the loops; an interlock between the first and second proportional three-way valves; at least a first and a second variable speed pump to generate the flow in the loops at least one coolant distribution unit (CDU) providing cooling to the RDHx configured on an electronics rack; a control unit controlling the valves; and at least one of a coolant temperature sensor and air temperature and humidity sensor providing input to the control unit, wherein flow is based on CDU temperature set point and coolant source attributes.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The accompanying drawings are not intended to be drawn to scale. For clarity, not every component may be labeled in every drawing.

DETAILED DESCRIPTION

The invention is susceptible of many embodiments. What follows is illustrative, but not exhaustive, of the scope of the invention.

As used here, heat generating equipment comprises electronics or computer systems or subsystems requiring cooling. Equipment may be contained in any enclosure, housing, cabinet, frame or rack.

Coolant may be water, but is not limited to water. For example, it may comprise an antifreeze solution, a chemical coolant, or a refrigerant. The term system coolant refers to the coolant circulating between a CDU and the component being cooled. Facility water or facility coolant refers to the data center water or coolant. Utilizing separate circuits for the facility and system coolants improves reliability by isolating the relatively poor quality facility water from the high quality system coolant.

In embodiments, free-cooling sources can be selected based on ambient conditions. Geothermal sources can be used in the warmest temperatures, underwater sources in moderate temperatures, and air-based free-cooling can be used during the coldest ambient temperatures.

Figure 1:
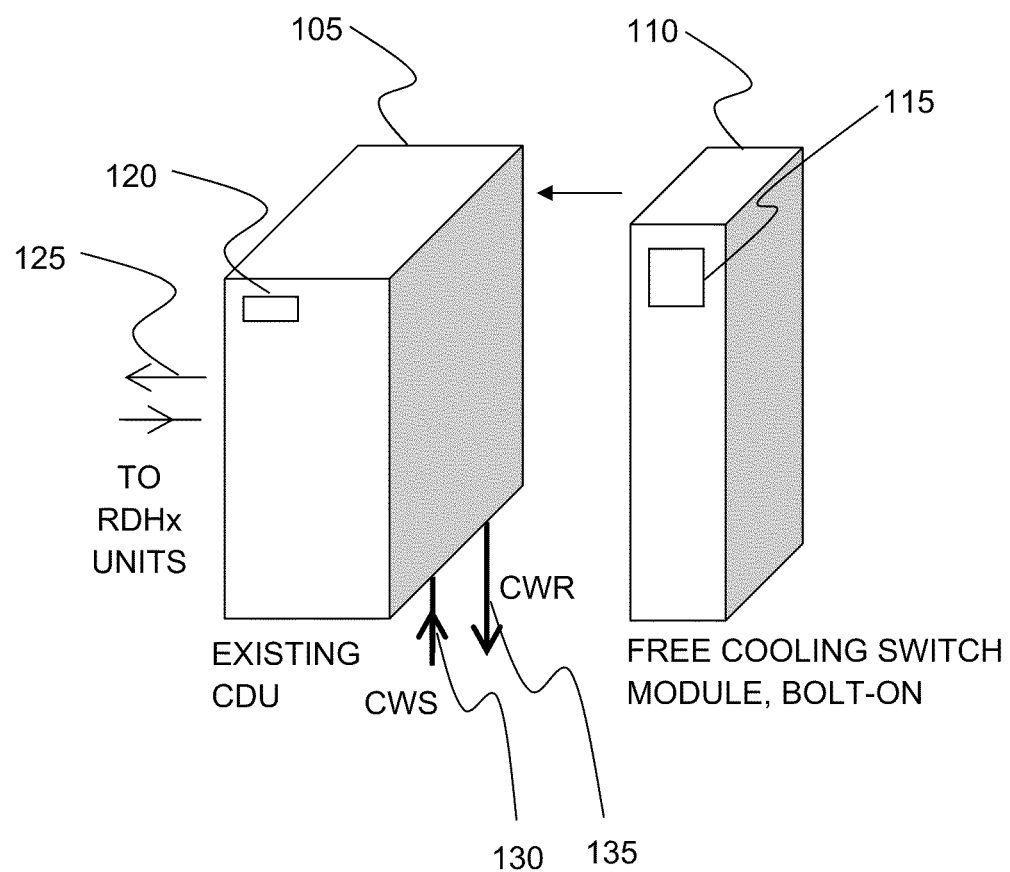
FIG. 1 is a perspective diagram of a CDU and a bolt on free-cooling switch module configured in accordance with an embodiment.

FIG. 1 illustrates a diagram of an embodiment of a bolt-on free-cooling switch module 100. Coolant distribution unit 105 is combined with free-cooling switch module 110. Free-cooling switch module 110 includes source selector display 115. Coolant distribution unit 105 includes display selector 120 and connections 125 to and from equipment heat exchangers. In embodiments, connections 125 interface with passive rear door heat exchanger (RDHx) units. Coolant distribution unit 105 further includes chilled water supply 130 and chilled water return 135.

Figure 2:
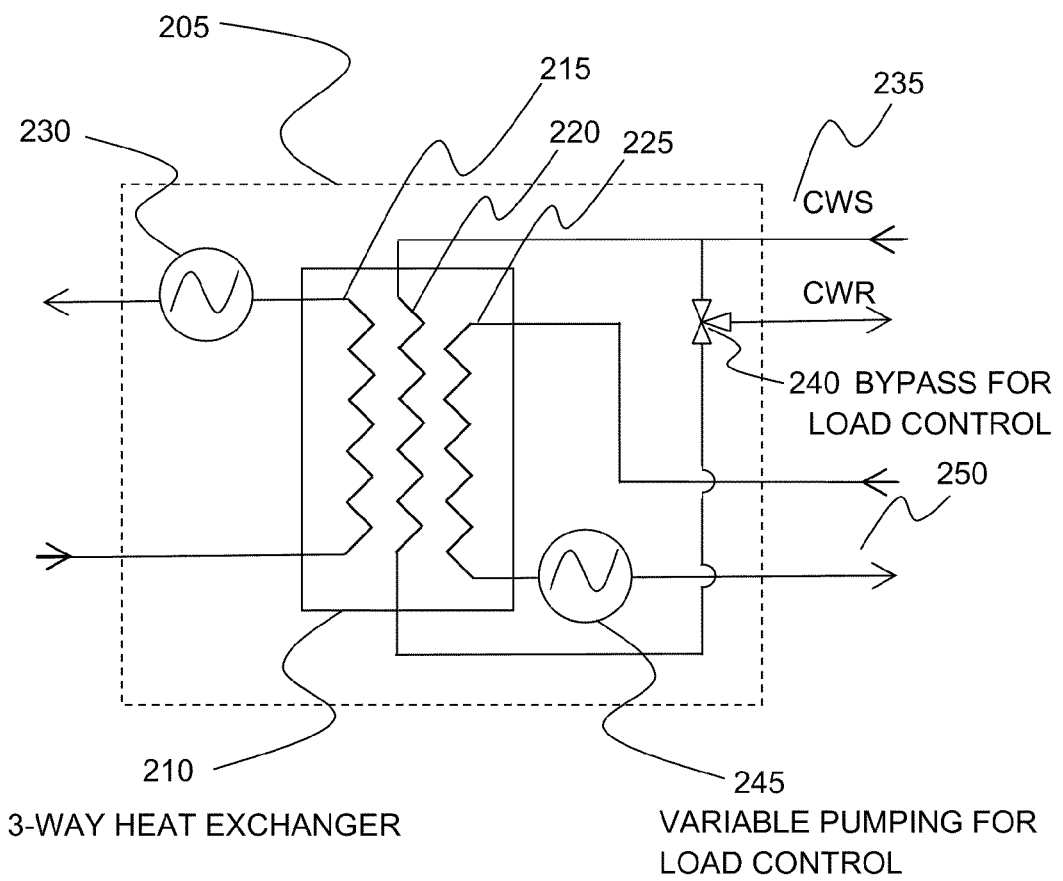
FIG. 2 is a partial schematic diagram of an integral free-cooling system configured in accordance with an embodiment.

FIG. 2 is a representative partial schematic diagram depicting some representative components 200 for an internal free cooling system 205. Three-way heat exchanger 210 includes loops 215, 220, and 225. In embodiments, heat exchanger 210 is a three-way plate heat exchanger. Loop 215 includes variable pump 230 and connects to heat generating equipment. Loop 220 includes chilled water supply and return 235. Bypass 240 for load control is in loop 220. Loop 225 includes variable pump 245 and connects 250 to free-cooling source. Pump 245 is a variable pump for load control.

Figure 3:
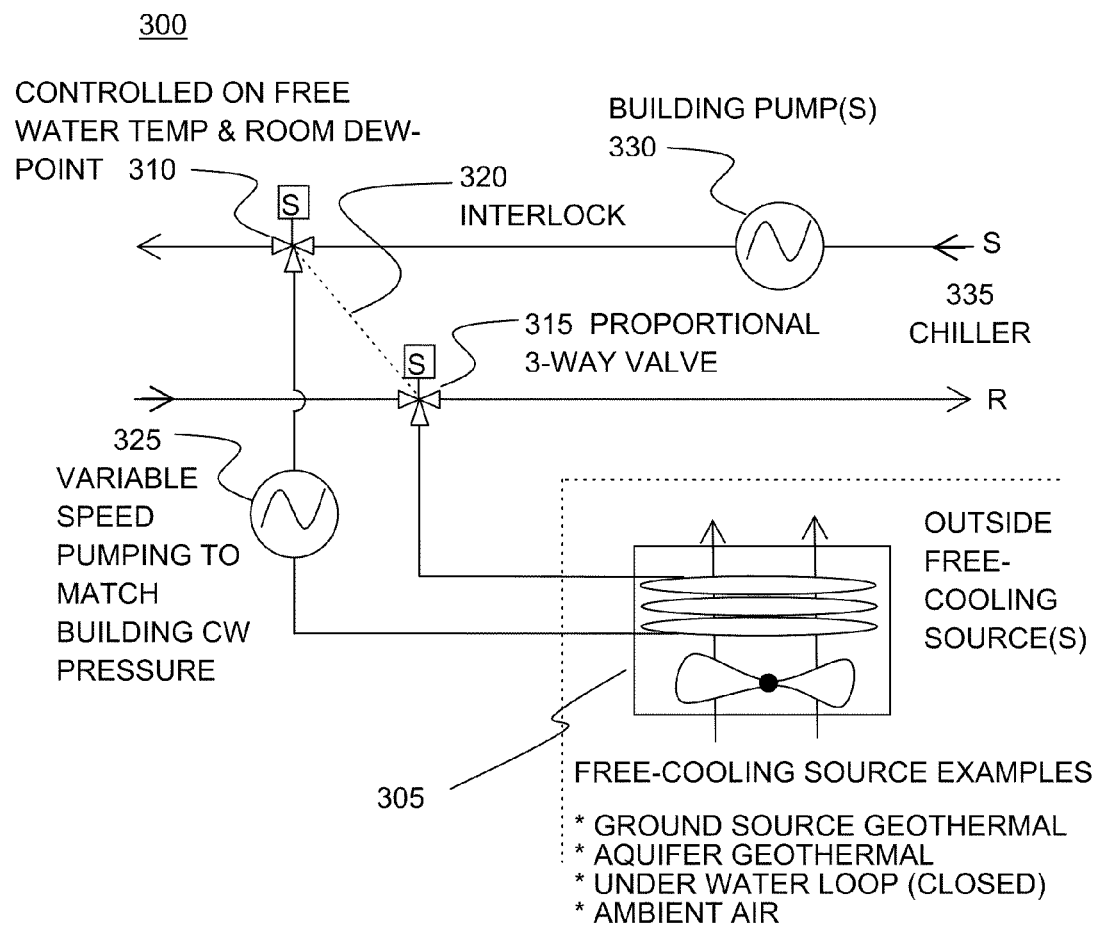
FIG. 3 is a partial schematic diagram of a direct flow free-cooling system configured in accordance with an embodiment.

FIG. 3 is a representative partial schematic diagram depicting components 300 for a direct flow free-cooling source embodiment. Free-cooling source(s) 305 connect to proportional three-way valves 310 and 315. Proportional three-way valves 310 and 315 are connected by interlock 320. Free-cooling sources can include non-limiting examples such as ground source geothermal, aquifer geothermal, underwater (closed) loop, and ambient air. Interlock 320 can be mechanical or implemented by software. Variable speed pump 325 in free-cooling circuit loop provides variable speed pumping to match building chilled water pressure. Building pump 330 is in loop to chiller 335.

Figure 4:
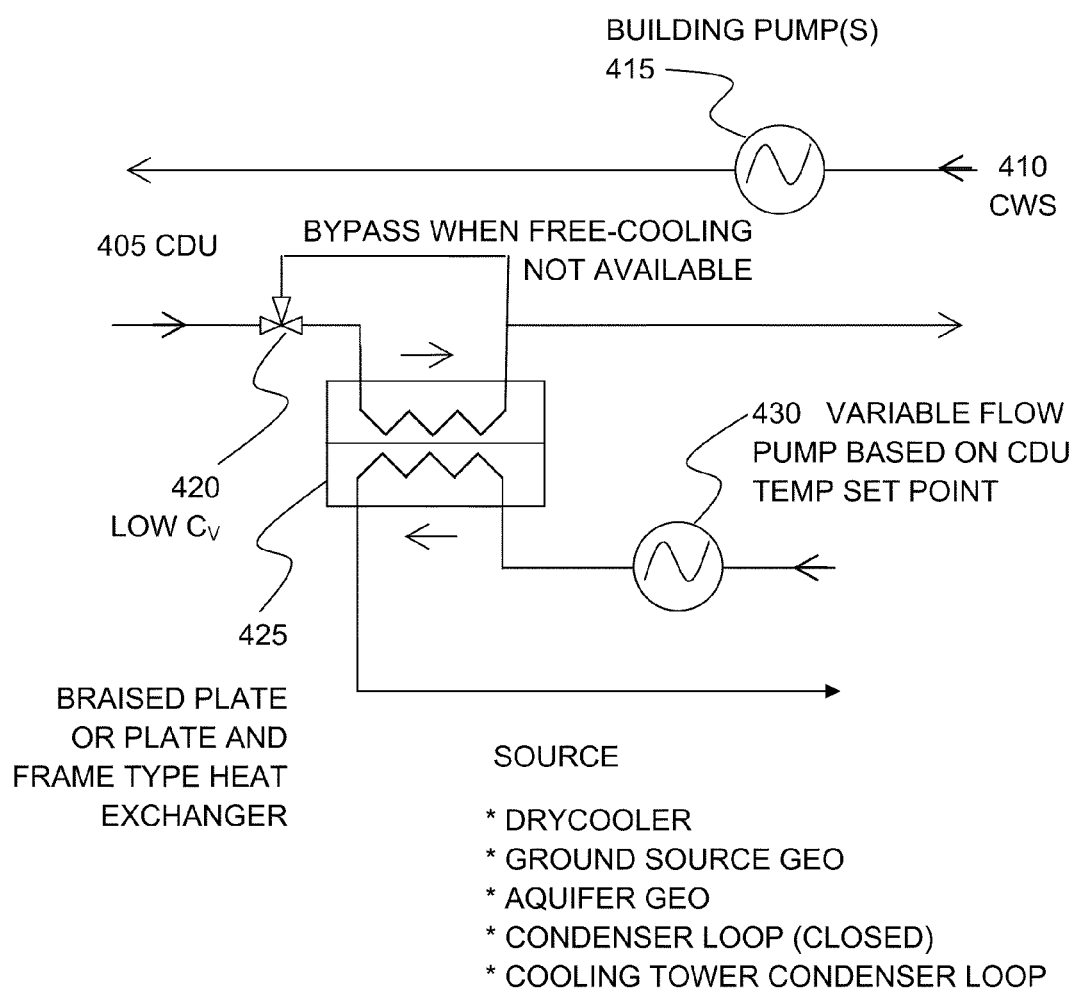
FIG. 4 is a partial schematic diagram of an indirect flow free-cooling system configured in accordance with an embodiment.

FIG. 4 is a representative partial schematic diagram depicting components for an indirect flow free-cooling source embodiment 400. CDU 405 receives chilled water 410 via building pump(s) 415. When available, free-cooling is controlled by low $C_v$ valve 420. Free-cooling is obtained through heat exchanger 425. As non-limiting examples, heat exchanger 425 can be a braised plate or a plate and frame type. Pump 430 provides circulation for the free-cooling loop. Pump 430 has a variable flow based on the CDU temperature set point.

Figure 5:
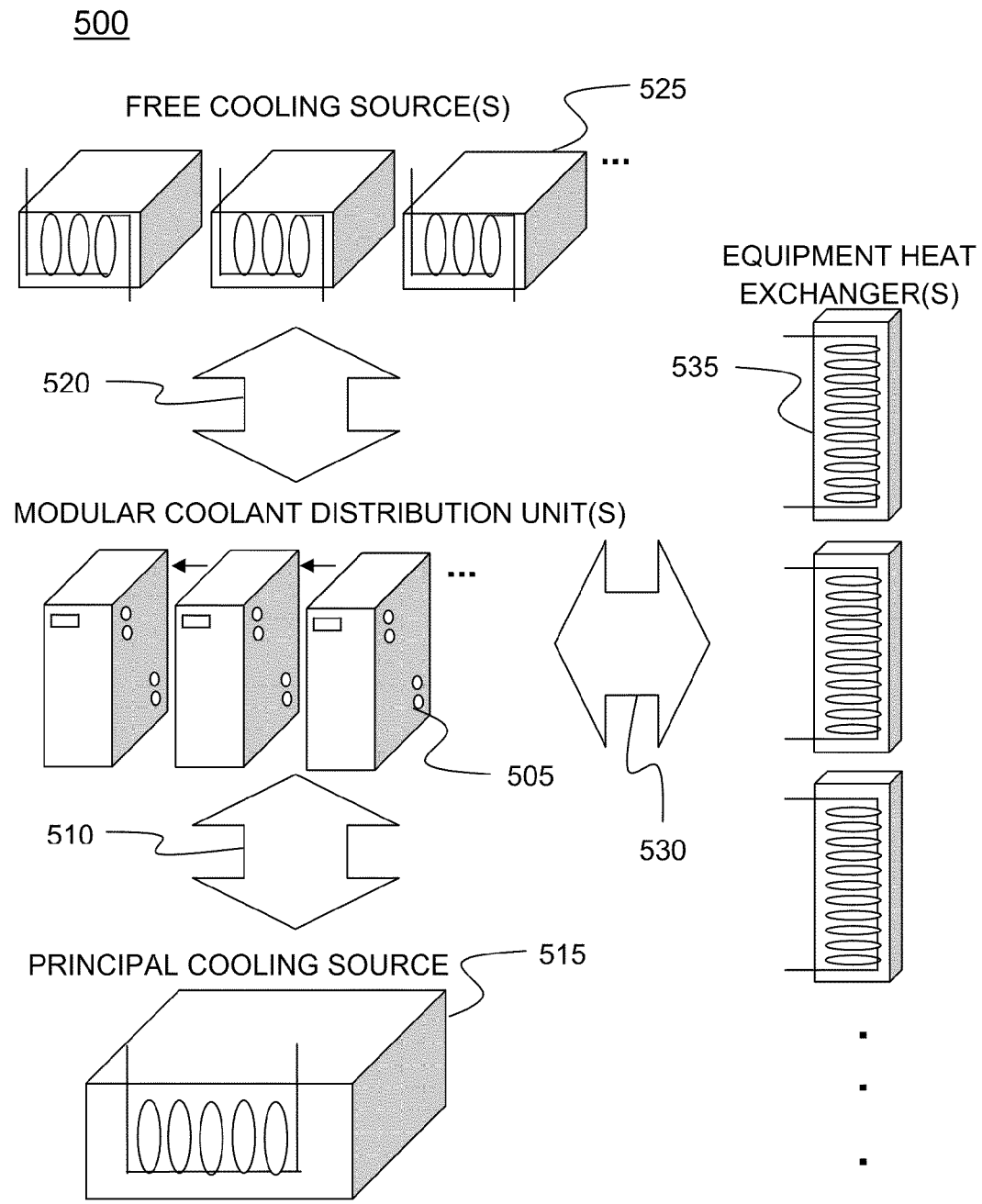
FIG. 5 is a perspective diagram of a modular free-cooling system overview configured in accordance with an embodiment.

FIG. 5 illustrates a configuration of cooling components 500 including one or more modular coolant distribution units 505 in connection 510 with a principal cooling source 515. Modular coolant distribution units 505 are also in connection 520 with one or more free cooling sources 525 and in connection 530 with at least one equipment heat exchanger 535.

Figure 6:
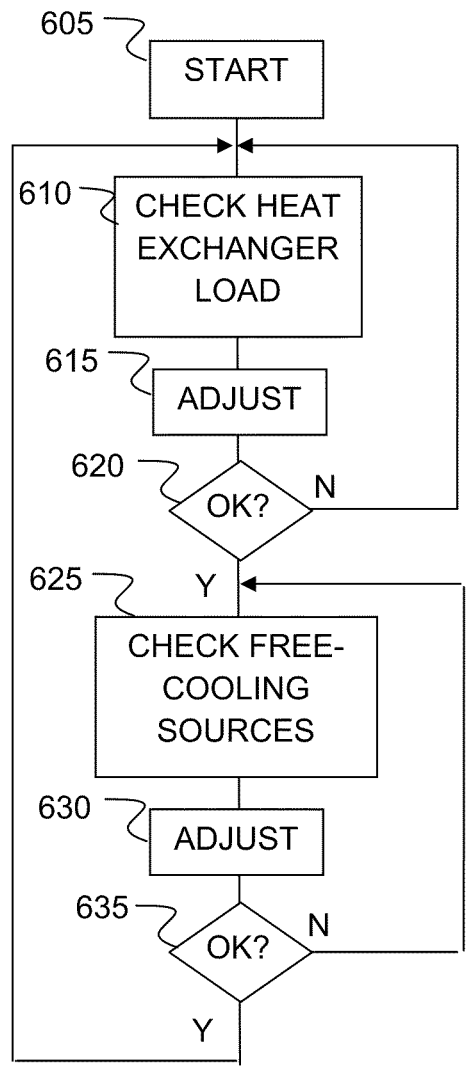
FIG. 6 is a flow chart of operation of the modular scalable CDU with free-cooling configured in accordance with an embodiment.

FIG. 6 is a flow chart 600 of an embodiment of the operation of the free-cooling system. From start 605, the system checks the heat exchanger load 610. Based on the results of the check, adjustments are made 615. Following adjustments 615, if the result is OK in step 620, the system proceeds to checking free-cooling sources 625. If not OK, the system returns to re-check the heat exchanger load at step 610. Based on the results of the free-cooling check 625, adjustments are made 630. Following adjustments 630, if the result is OK in step 635, the system returns to re-check the heat exchanger load 610. If not OK, the system returns to re-check the free-cooling sources 625.

Figure 7:
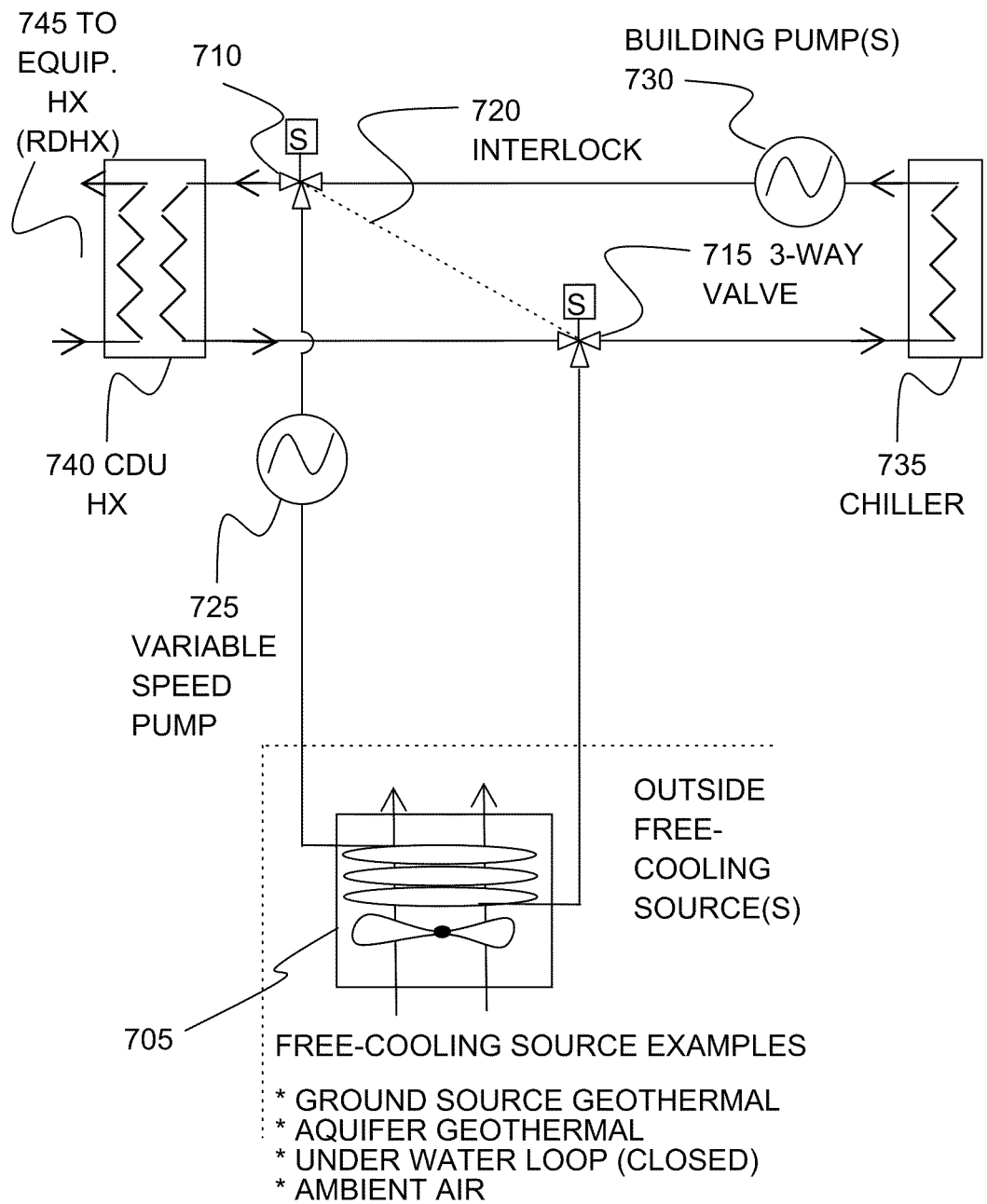
FIG. 7 is a partial schematic diagram of a single loop free-cooling system configured in accordance with an embodiment.

FIG. 7 is a partial schematic diagram of a single loop free-cooling system 700 configured in accordance with an embodiment. Free-cooling source 705 connects through valve 710 and proportional 3-way valve 715 that are controlled by interlock 720. Variable speed pump 725 provides a match to building chilled water pressure. Building pump(s) 730 is in connection with chiller 735. CDU heat exchanger 740 interfaces with loop to equipment heat exchanger (rear door heat exchanger (RDHX)) 745.

Figure 8:
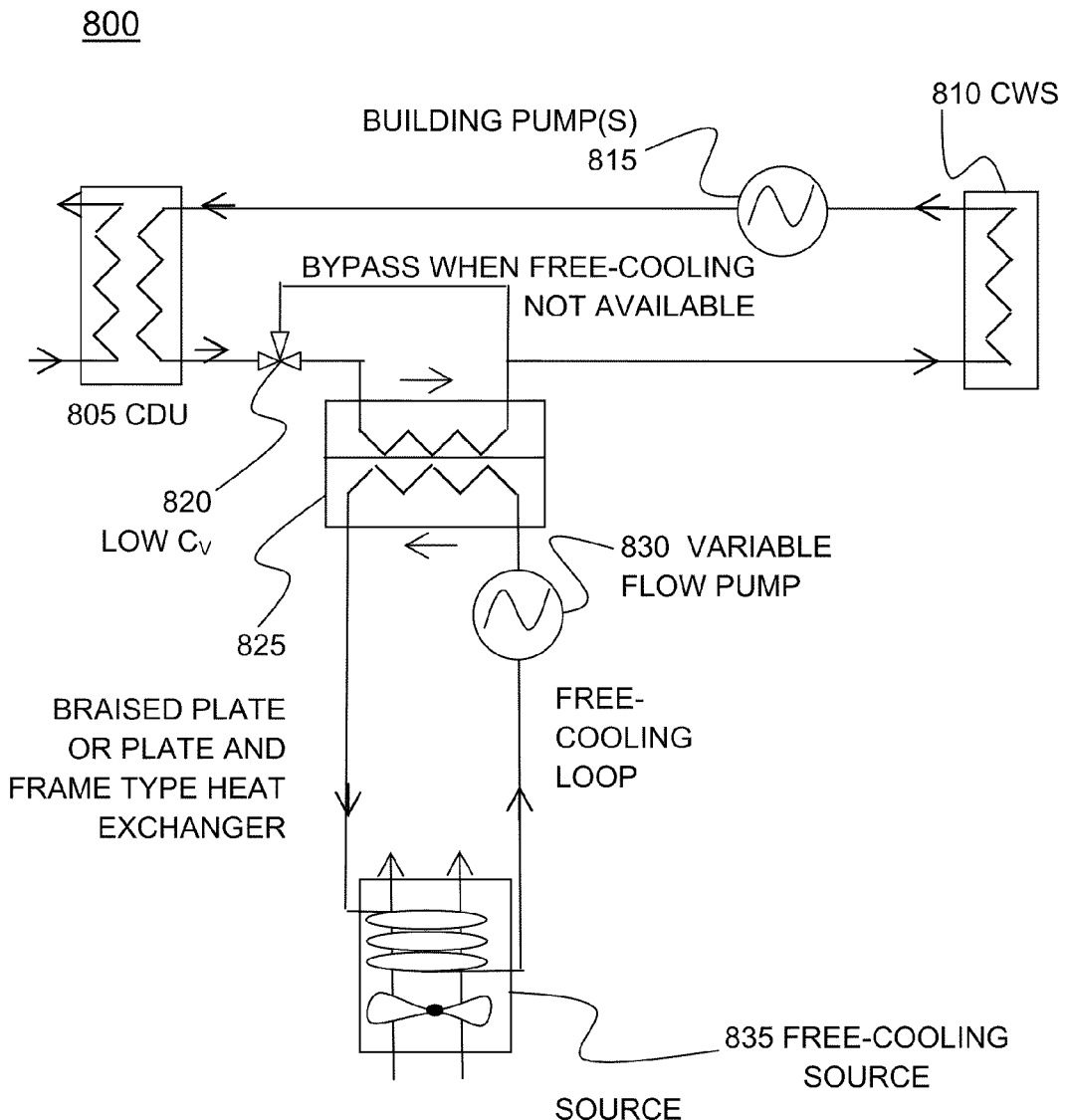
FIG. 8 is a partial schematic diagram with a liquid/liquid heat exchanger free-cooling system configured in accordance with an embodiment.

FIG. 8 is a partial schematic diagram with a liquid/liquid heat exchanger free-cooling system 800 configured in accordance with an embodiment. CDU 805 is in connection with CWS 810. In the circuit is building pump 815 and low $C_v$ valve 820. Plate heat exchanger 825 transfers heat with free-cooling source 835. Construction of exchanger 825 can employ a braised plate or, for example, a plate and frame. Variable flow pump 830 circulates coolant from free-cooling source 835 and provides flow based on CDU temperature set point.

Figure 9:
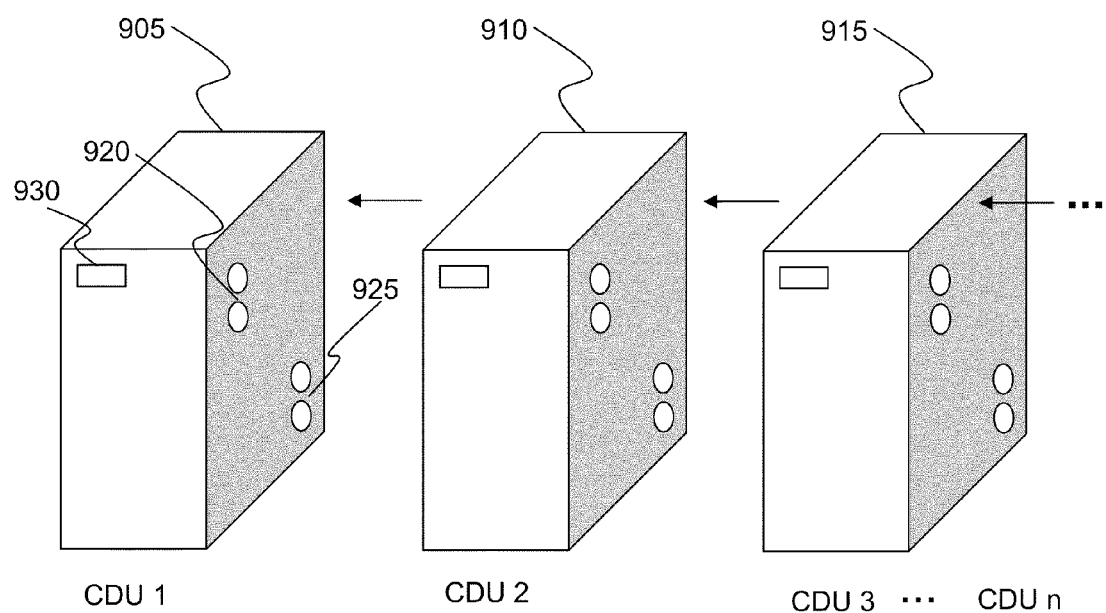
FIG. 9 depicts part of a modular cooling system with multiple CDUs configured in accordance with an embodiment.

FIG. 9 is a depiction of part of a cooling system embodiment 900 with three scalable modular coolant distribution units 905, 910, and 915. Each unit includes primary connection 920, secondary connection 925, and selector display 930. Multiple modules are connected together to provide additional capacity and or redundancy. An additional module can be used for a secondary distribution manifold or a field-supplied manifold. Each may have integral or bolt-on free-cooling support.

Figure 10:
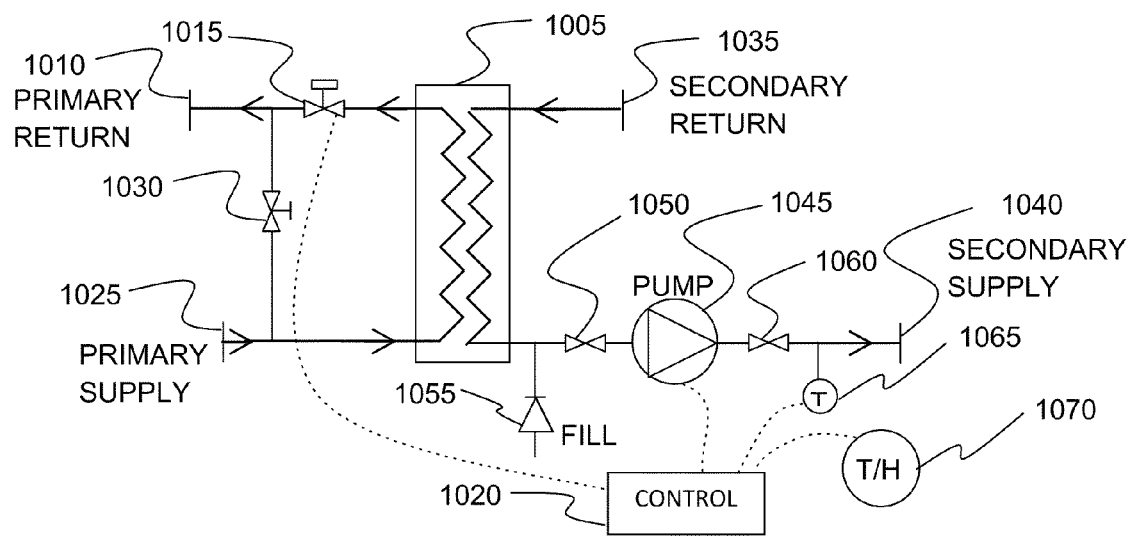
FIG. 10 is a modular CDU partial schematic diagram configured in accordance with an embodiment.

FIG. 10 illustrates a partial schematic of an embodiment of a scalable modular coolant distribution unit 1000 with heat exchanger 1005 including primary return 1010 controlled by valve 1015. In embodiments, heat exchanger 1005 is a brazed plate heat exchanger. Valve 1015 is controlled by control unit 1020. Primary supply 1025 feeds heat exchanger 1005. Manual bypass valve 1030 controls flow between primary supply 1025 and primary return 1010 lines. Secondary supply 1040 includes pump 1045. Pump 1045 is connected to control unit 1020. Between pump 1045 and heat exchanger 1005 is valve 1050. After pump 1045 in secondary supply 1040, is valve 1060. After valve 1060 in secondary supply 1040 is coolant temperature sensor 1065. Coolant temperature sensor 1065 is connected to control unit 1020. Air temperature and humidity sensor 1070 is also connected to control unit 1020.

Other and various embodiments will be readily apparent to those skilled in the art, from this description, figures, and the claims that follow.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An integrated, incremental, liquid-liquid free-cooling system accommodating varying equipment rack heat loads in a data center comprising:
   at least a first passive rear door heat exchanger (RDHx) coolant loop interfacing with an RDHx;
   at least a second free cooling source coolant loop interfacing with a free cooling source;
   at least a third chilled water supply (CWS) coolant loop interfacing with a CWS;
   at least one bypass circuit for load control in at least one of said loops;
   a three-way heat exchanger interconnecting said first, second, and third loops, wherein at least one of said first, second, or third loops comprise automatic filling and bleeding, wherein said three-way heat exchanger simultaneously transfers heat between said first, second, and third loops;
   at least a first and a second proportional three-way valve controlling flow in said loops;
   an interlock between said first and second proportional three-way valves;
   at least a first and a second variable speed pump to generate said flow in said loops;
   at least one coolant distribution unit (CDU) providing cooling to said RDHx configured on an electronics rack;
   a control unit controlling said valves; and
   at least one of a coolant temperature sensor and air temperature and humidity sensor providing input to said control unit, wherein flow is based on CDU temperature set point and a temperature of said free cooling source and a temperature of said chilled water supply.

2. The integrated, incremental, liquid-liquid free cooling system of claim 1, wherein the at least second free cooling source is selected from the group consisting of: ground source geothermal, aquifer geothermal, underwater closed loop, and ambient air.

3. The integrated, incremental, liquid-liquid free cooling system of claim 1, comprising a plurality of modular coolant distribution units (CDUs).

4. The integrated, incremental, liquid-liquid free cooling system of claim 1, wherein said three-way heat exchanger comprises a heat exchanger with a plurality of plates joined by brazing.

5. The integrated, incremental, liquid-liquid free cooling system of claim 1, wherein said three-way heat exchanger comprises a plate and frame heat exchanger.

6. The integrated, incremental, liquid-liquid free cooling system of claim 1, wherein the integrated, incremental, liquid-liquid free-cooling systems interfaces more than two coolant sources to said RDHx.

\* \* \* \* \*